(12) United States Patent
Higuchi et al.

(10) Patent No.: US 6,593,679 B2
(45) Date of Patent: Jul. 15, 2003

(54) SURFACE ACOUSTIC WAVE ELEMENT, FREQUENCY FILTER, FREQUENCY OSCILLATOR, ELECTRONIC CIRCUIT, AND ELECTRONIC APPARATUS

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/963,457

(22) Filed: Sep. 27, 2001

(65) Prior Publication Data

US 2002/0047497 A1 Apr. 25, 2002

(30) Foreign Application Priority Data

| Sep. 27, 2000 | (JP) | 2000-294330 |
| Sep. 27, 2000 | (JP) | 2000-294331 |
| Sep. 26, 2001 | (JP) | 2001-292819 |

(51) Int. Cl.⁷ ............................................ H03H 9/25
(52) U.S. Cl. ................................................ 310/313 A
(58) Field of Search ..................................... 310/313 A (56) References Cited

U.S. PATENT DOCUMENTS

| 5,235,236 A | * | 8/1993 | Nakahata et al. ........ 310/313 R |
| 5,440,189 A | * | 8/1995 | Nakahata et al. ........ 310/313 R |
| 5,571,603 A | | 11/1996 | Utumi et al. ................. 428/212 |
| 5,766,783 A | | 6/1998 | Utsumi et al. ............... 428/698 |
| 2001/0020700 A1 | * | 9/2001 | Inoue et al. .................... 257/20 |

FOREIGN PATENT DOCUMENTS

JP   A 8-239752   9/1996   ............ C23C/14/06

* cited by examiner

Primary Examiner—Thomas M. Dougherty
(74) Attorney, Agent, or Firm—Oliff & Berridge, PLC

(57) ABSTRACT

The present invention provides a surface wave acoustic element which has a large surface acoustic wave propagation velocity and can be used in high-frequency regions by using a hard layer other than diamond which has inferior surface flatness. This surface acoustic wave element has a sapphire single crystal substrate, a hard layer formed on the sapphire single crystal substrate and having a composition containing $(Al_{1-x}M1_x)_2O_3$ ($0 \leq x \leq 0.5$) in which at least one element M1 (M1=B, Ga, In, Ti, V, Cr, Mn, Fe, Co) is added to sapphire, and a piezoelectric layer formed on the hard layer.

13 Claims, 6 Drawing Sheets

SURFACE ACOUSTIC WAVE ELEMENT, FREQUENCY FILTER, FREQUENCY OSCILLATOR, ELECTRONIC CIRCUIT, AND ELECTRONIC APPARATUS

BACKGROUND OF THE INVENTION

1. Field of the Invention

The present invention relates to a surface acoustic wave element, an electronic circuit, a frequency filter, a frequency oscillator and an electronic apparatus, and more specifically, to a surface acoustic wave element which uses a piezoelectric thin film on a sapphire single crystal substrate, and an electronic circuit, a frequency filter and a frequency oscillator provided with said surface acoustic wave element, and an electronic apparatus equipped therewith.

2. Description of Related Art

Accompanying the remarkable progress of the telecommunications field focusing primarily on cellular telephones and other mobile communications, the demand for surface acoustic wave elements is increasing rapidly. In addition, accompanying the development of an information society in recent years, the demand for not only mobile communication devices, but also for tuners capable of receiving broadcast satellite (BS) and commercial satellite (CS) broadcasts is also growing, and the proliferation of computer networks has accelerated the pace of HUB and other electrical equipment.

During the development of surface acoustic wave elements, it is important to make improvements in the three areas of compact size, high efficiency and high frequency, and in order to accomplish this, it is necessary to realize a larger electromechanical coupling coefficient (to be abbreviated as $k^2$), a central frequency temperature coefficient that is closer to zero (to be abbreviated as TCF) and a larger surface acoustic wave propagation velocity (to be abbreviated as $V_s$).

In the past, a structure in which an inter-digital transducer (to be abbreviated as IDT) was formed on a piezoelectric single crystal was primarily used as a surface acoustic wave element. Typical examples of piezoelectric single crystals include quartz crystal, lithium niobate (to be abbreviated as LiNbO$_3$) and lithium tantalate (to be abbreviated as LiTaO$_3$). For example, in the case of RF filters that require a broader band and reduced loss of the pass band, LiNbO$_3$ having a large $k^2$ is used. On the other hand, in the case of IF filters requiring stable temperature characteristics even in a narrow band, quartz crystal having a small TCF is used. Moreover, LiTaO$_3$, in which $k^2$ and TCF are between those of LiNbO$_3$ and quartz crystal, is used in intermediate applications.

However, since elements that satisfy all requirements of a high $k^2$, zero TCF and high $V_s$ cannot be realized with piezoelectric single crystal alone, a surface acoustic wave element has been proposed that uses a laminated structure including a substrate and piezoelectric thin film. This element combines a substrate and thin film material, and allows the obtaining of characteristics superior to single crystal by controlling the orientation direction of the thin film and film thickness. For example, by forming a piezoelectric thin film having a large $k^2$ on a substrate having a TCF near zero, it is possible to realize a surface acoustic wave element for which the overall characteristics include a high $k^2$ and zero TCF.

Here, in the case of considering the use of a surface acoustic wave element as an oscillator in particular, although specific examples of the oscillators include high order increase types, phase synchronization types, and direct oscillation types, the direct oscillation types are desirable in order to reduce the size of the element and improve jitter. Therefore, it is important to increase the oscillation frequency. In the case of increasing the oscillation frequency, an element structure that realizes a higher frequency by laminating a piezoelectric layer with a hard layer having a high $V_s$ is promising even in consideration of limits on the design rule of the electrode pitch of the IDT. In Japanese Unexamined Patent Application, First Publication No. Hei 6-164294, a diamond film is formed as a hard layer on an Si substrate, onto which a ZnO piezoelectric layer and SiO$_2$ protective layer are additionally formed, by which an extremely important structure satisfying all of the requirements of high $k^2$, zero TCF and high $V_s$ can be obtained.

However, the surface acoustic wave elements having the hard layer and the piezoelectric layer of the prior art had the following problems.

In the case of using the diamond thin film hard layer described in Japanese Unexamined Patent Application, First Publication No. Hei 6-164294, although high $V_s$ can be obtained, surface flatness cannot be obtained. Under the present circumstances, in addition to the polishing process being difficult and requiring considerable time due to the hardness of the diamond thin film, since the diamond film is polycrystalline, surface flatness is considerably inferior to that of ordinary piezoelectric single crystal substrates. Thus, the crystallinity of the piezoelectric thin film deposited on the diamond thin film also decreases, thereby preventing the obtaining of an epitaxial film. The characteristics of the piezoelectric thin film as surface acoustic wave elements are greatly dependent on its crystallinity, and in the case of using the polycrystalline diamond thin film hard layer, problems occur including a decrease in $k^2$ in particular.

Thus, at the time of practical application, it is important to attempt to increase $V_s$ by a single crystal hard layer other than diamond. Sapphire is one example of a hard layer and a substrate material other than diamond which is a single crystal, is easily obtainable, and has a large $V_s$. Although the $V_s$ of sapphire is inferior to that of diamond, which has a $V_s$ of about 10000 m/s, its $V_s$ is still large, and its single crystal substrate is inexpensive and is used universally. Since various types of piezoelectric thin films also demonstrate epitaxial growth on such substrates, it is an extremely important material. Here, since the propagation velocity of a surface acoustic wave ($V_s$) is Vs $(E/\rho)^{1/2}$ when Young's modulus is represented with E and density is represented with $\rho$, if it were possible to increase the Young's modulus and decrease the density of sapphire through the use of additives, it would be possible to increase its propagation velocity to a level comparable to that of diamond.

SUMMARY OF THE INVENTION

The present invention is accomplished in view of the above circumstances, and aims at providing a surface acoustic wave element which uses a sapphire hard layer having a large Vs and which is able to accommodate higher frequencies of the band used, and providing an electronic circuit, a frequency filter, and a frequency oscillator, each of which is provided with said surface acoustic wave element, and an electronic apparatus equipped therewith.

In order to solve the above problems, the present invention provides a surface acoustic wave element including a sapphire single crystal substrate, a hard layer formed on said sapphire single crystal substrate and having a composition containing $(Al_{1-x}M1_x)_2O_3$ ($0 \leq x \leq 0.5$)) in which at least one element M1 (M1=B, Ga, In, Ti, V, Cr, Mn, Fe, Co) is added to sapphire, and a piezoelectric layer formed on said hard layer.

According to the above composition, Vs of the surface acoustic wave is increased by either increasing Young's modulus or decreasing density of the hard layer, thereby enabling the surface acoustic wave element to be used in high frequency regions.

In addition, the above hard layer can have a corundum crystal structure.

According to this composition, as a result of conforming the lattice to a single crystal substrate in which the hard layer has the same crystal structure, the crystallinity of the thin film is improved and $k^2$ is improved, thereby making it possible to conserve the electrical power of the surface acoustic wave element.

In addition, the above piezoelectric layer can have a composition containing $(Al_{1-x}B_x)N$ ($0 \leq x \leq 0.5$) in which boron nitride is added to aluminum nitride, and also can have a wurtzite crystal structure.

According to this composition, together with increasing the $V_s$ of the surface acoustic wave by either increasing the Young's modulus or decreasing the density of the aluminum nitride, by conforming the lattice to the hard layer by reducing the lattice constant of the aluminum nitride, the crystallinity of the thin film is improved and $k^2$ is improved, thereby making it possible to increase the frequency and conserve electrical power of the surface acoustic wave element.

In addition, the above piezoelectric layer can have a composition containing $(Zn_{1-x}M2_x)O$ ($1 \leq x > 0.5$) in which at least one element M2 (M2=Li, Mg, Fe, Co., Ni, Cu) is added to zinc oxide, and can also have a wurtzite crystal structure.

According to this composition, together with increasing the $V_s$ of the surface acoustic wave by either increasing the Young's modulus or decreasing the density of the zinc oxide, by conforming the lattice to the hard layer by reducing the lattice constant of the zinc oxide, the crystallinity of the thin film is improved and $k^2$ is improved, thereby making it possible to increase the frequency and conserve electrical power of the surface acoustic wave element.

In addition, the present invention provides a surface acoustic wave element including a single crystal substrate having a composition containing $(Al_{1-x}M1_x)_2O_3$ ($0 \leq x \leq 0.5$) in which element M1 (M1=B, Ga, In, Ti, V, Cr, Mn, Fe, Co) is added to sapphire and having a corundum crystal structure, and a piezoelectric layer formed on said single crystal substrate.

According to this composition, the surface acoustic wave element can be used at a higher frequency region by increasing the $V_s$ of the surface acoustic wave by either increasing the Young's modulus or decreasing the density of the sapphire single crystal substrate.

In addition, the above piezoelectric layer can have a composition containing $(Al_{1-x}B_x)N$ ($0 \leq x \leq 0.5$) in which boron nitride is added to aluminum nitride, and can also have a wurtzite crystal structure.

According to this composition, together with increasing the $V_s$ of the surface acoustic wave by either increasing the Young's modulus or decreasing the density of the aluminum nitride, by conforming the lattice to the hard layer by reducing the lattice constant of the aluminum nitride, the crystallinity of the thin film is improved and $k^2$ is improved, thereby making it possible to increase the frequency and conserve electrical power of the surface acoustic wave element.

In addition, the above piezoelectric layer can have a composition containing $(Zn_{1-x}M2_x)O$ ($0 \leq x \leq 0.5$) in which at least one element M2 (M2=Li, Mg, Fe, Co., Ni, Cu) is added to zinc oxide, and can also have a wurtzite crystal structure.

According to this composition, together with increasing the $V_s$ of the surface acoustic wave by either increasing the Young's modulus or decreasing the density of the zinc oxide, by conforming the lattice to the hard layer by reducing the lattice constant of the zinc oxide, the crystallinity of the thin film is improved and $k^2$ is improved, thereby making it possible to increase the frequency and conserve electrical power of the surface acoustic wave element.

In addition, in order to solve the above problems, the present invention provides a frequency filter including a first electrode on the above piezoelectric layer equipped with any one of the surface acoustic wave elements described above, and a second electrode which is formed on said piezoelectric layer and which converts to an electrical signal by resonating to a specific frequency or a frequency of a specific band of a surface acoustic wave generated in said piezoelectric layer by an electrical signal applied to said first electrode.

According to this composition, since $V_s$ of the surface acoustic wave is high, the electrical signal of the specific frequency or the frequency of the specific band can be filtered by applying an electrical signal of a higher frequency to the first electrode.

In addition, in order to solve the above problems, the present invention provides a frequency oscillator including an electrical signal application electrode which is formed on the above piezoelectric layer equipped with any one of the surface acoustic wave elements described above and which generates a surface acoustic wave in said piezoelectric layer according to an applied electrical signal, and a resonance electrode formed on said piezoelectric layer which resonates a specific frequency component or frequency component of a specific band of the surface acoustic wave generated by said electrical signal application electrode.

According to this composition, since $V_s$ of the surface acoustic wave is high, in addition to being able to generate a surface acoustic wave by applying an electrical signal of a higher frequency to the electrical signal application electrode, a surface acoustic wave of a higher frequency can be resonated. As a result, signals of higher frequencies can be oscillated.

In addition, in order to solve the above problems, the present invention provides an electronic circuit including the above frequency oscillator, and an electrical signal supply element which applies an electrical signal to the above electrical signal application electrode provided in said frequency oscillator, wherein a specific frequency component is selected from the frequency components of said electrical signal or the frequency components of said electrical signal are converted to a specific frequency component, or a prescribed modulation is imparted to said electrical signal followed by a prescribed demodulation or prescribed wave detection.

According to this composition, since a specific frequency component is selected from signals of a higher frequency, or signals of a higher frequency are converted to a specific frequency component, or a prescribed modulation is imparted to said electrical signal followed by a prescribed demodulation or prescribed wave detection, an electronic circuit can be provided that electrically performs various operations on an electrical signal of a higher frequency.

In addition, in order to solve the above problems, the present invention provides an electronic apparatus that contains at least one of the above frequency filter, the above frequency oscillator, and the above electronic circuit.

According to this composition, since at least one of the frequency filter, the frequency oscillator, and the electronic circuit that operate at a higher frequency is contained, mobile communication devices, satellite broadcast tuners and various other electronic apparatuses can be provided in which higher frequencies are scheduled to be used in the future.

DETAILED DESCRIPTION OF THE INVENTION

The following provides a detailed explanation of a surface acoustic wave element, electronic circuit, frequency filter, frequency oscillator and electronic apparatus according to embodiments of the present invention with reference to the drawings.

First Embodiment of a Surface Acoustic Wave Element

Figure 1:
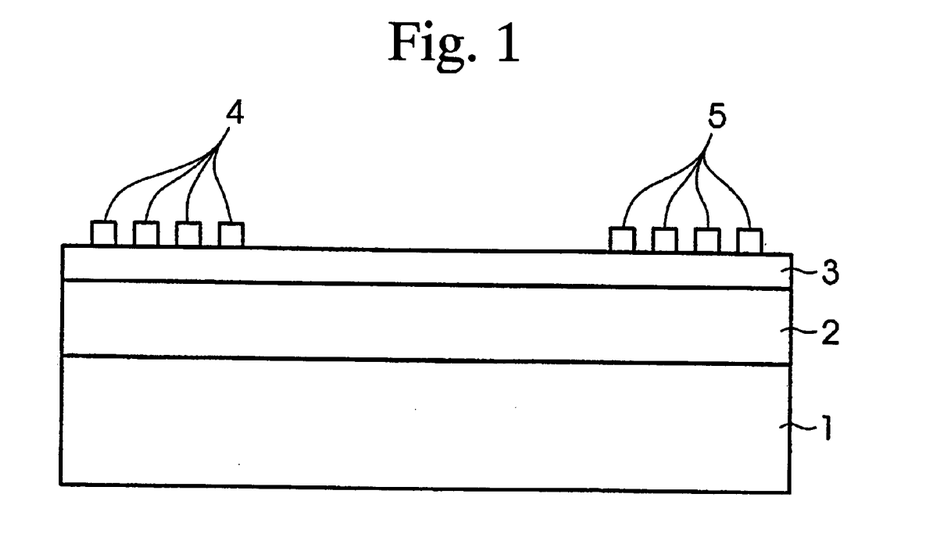
FIG. 1 is a cross-sectional view of a surface acoustic wave element according to a first embodiment of the present invention.

FIG. 1 is a cross-sectional view of a surface acoustic wave element according to the first embodiment of the present invention. An $(Al_{0.97}B_{0.03})_2O_3$ hard layer 2 was deposited on an R plane (102) sapphire single crystal substrate 1 under conditions of a substrate temperature of 800° C. and oxygen partial pressure of $1.33 \times 10^{-2}$ hPa by laser ablation using an $(Al_{0.97}B_{0.03})_2O_3$ target in which B (boron) was added to Al at 3 mol %. However, the amount of B added, substrate temperature, oxygen partial pressure and substrate surface azimuth are not limited to these.

Next, an $(Al_{0.97}B_{0.03})N$ piezoelectric layer 3 was deposited on the $(Al_{0.97}B_{0.03})_2O_3$ hard layer 2 under conditions of a substrate temperature of 800° C. and oxygen partial pressure of $1.33 \times 10^{-5}$ hPa by laser ablation using an $(Al_{0.97}B_{0.03})N$ target in which BN was added to AlN at 3 mol %. However, the amount of BN added, substrate temperature and oxygen partial pressure are not limited to these.

Moreover, after vapor deposition of metal aluminum, a continuous patterning process including resist coating, exposure, dry etching and resist removal was carried out to form IDT electrodes 4 and 5 on the $(Al_{0.97}B_{0.03})N$ piezoelectric layer 3.

The resulting surface acoustic wave element had an orientation film on the film surface including $(Al_{0.97}B_{0.03})N$ (110)//$(Al_{0.97}B_{0.03})_2O_3$ (102)//sapphire (102) in the vertical direction, and $(Al_{0.97}B_{0.03})N$ [001]//$(Al_{0.97}B_{0.03})_2O_3$ [101]//sapphire [101] in the in-plane direction.

The $V_s$ of the resulting surface acoustic wave element as determined from the delay time $V_{open}$ of the surface acoustic wave between the IDT electrodes 4 and 5 was 8500 m/s. $k^2$ was 0.01 when determined from the difference with delay time $V_{short}$ of the surface acoustic wave in the case of covering the area between the IDT electrodes 4 and 5 with a metal thin film. In addition, the resonance frequency was 4.2 GHz. Since $V_s$ is 7500 m/s and $k^2$ is 0.01 in the case of not using the $(Al_{0.97}B_{0.03})_2O_3$ hard layer 2, the $(Al_{0.97}B_{0.03})_2O_3$ hard layer 2 clearly has the effect of increasing $V_s$ without lowering $k^2$.

In addition, similar effects were obtained in the case of using $(Al_{1-x}M1_x)_2O_3$ ($0 \leq x \leq 0.5$), in which at least one M1=Ga, In, Ti, V, Cr, Mn, Fe or Co was added instead of B, as the hard layer. Moreover, similar effects were also obtained in the case of using $(Zn_{1-x}M2_x)O$ ($0 \leq x \leq 0.5$), in which at least one element M2 (M2=Li, Mg, Fe, Co, Ni or Cu) was added to zinc oxide, as the piezoelectric layer instead of $(Al_{1-x}B_x)N$ ($0 \leq x \leq 0.5$). In addition, other piezoelectric substances such as $KNbO_3$ and $LiNbO_3$ are also effective. Furthermore, similar effects were also obtained in the case of forming IDT electrodes beneath the piezoelectric layer. Similar effects were also obtained in the case of depositing an $SiO_2$ layer on the surface for improving frequency-temperature characteristics and protecting the surface.

According to the above composition, by depositing the $(Al_{1-x}M1_x)_2O_3$ ($0 \leq x \leq 0.5$) hard layer, in which at least one element M1 (M1=B, Ga, In, Ti, V, Cr, Mn, Fe or Co) is added, on the sapphire single crystal substrate, and then depositing the piezoelectric layer of $(Al_{1-x}B_x)N$ ($0 \leq x \leq 0.5$) or $(Zn_{1-x}M2_x)O$ ($1 \leq x \leq 0.5$) (M2=Li, Mg, Fe, Co, Ni or Cu), a high $V_s$ can be realized without lowering $k^2$.

Second Embodiment of a Surface Acoustic Wave Element

Figure 2:
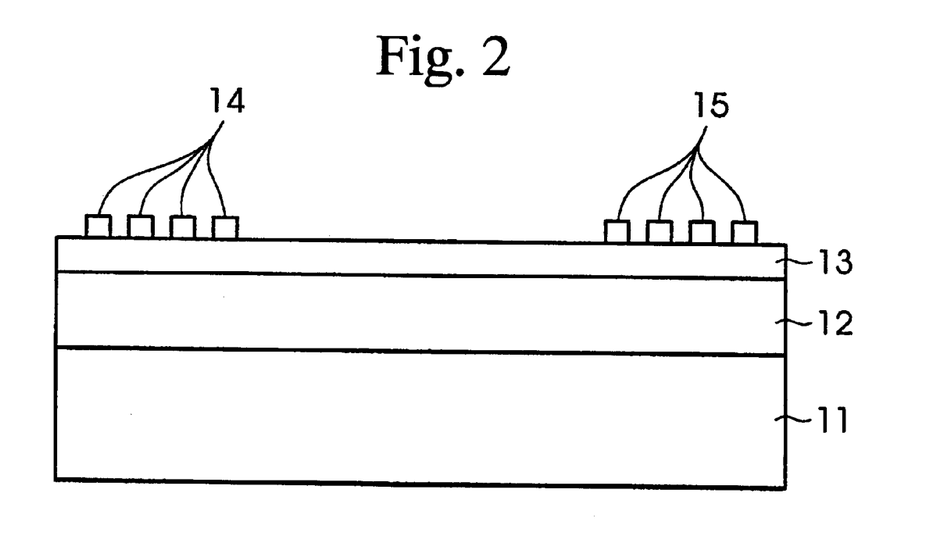
FIG. 2 is a cross-sectional view of a surface acoustic wave element according to a second embodiment of the present invention.

FIG. 2 is a cross-sectional view of a surface wave acoustic element according to the second embodiment of the present invention. An $(Al_{0.97}B_{0.03})_2O_3$ hard layer 12 was deposited on a C plane (001) sapphire single crystal substrate 11 under conditions of a substrate temperature of 800° C. and oxygen partial pressure of $1.33 \times 10^{-2}$ hPa by laser ablation using an $(Al_{0.97}B_{0.03})_2O_3$ target in which B was added to Al at 3 mol %. However, the amount of B added, substrate temperature, oxygen partial pressure and substrate surface azimuth are not limited to these.

Next, a $(Zn_{0.97}Li_{0.03})O$ piezoelectric layer 13 was deposited on the $(Al_{0.97}B_{0.03})_2O_3$ hard layer 12 under conditions of a substrate temperature of 800° C. and oxygen partial pressure of $1.33 \times 10^{-2}$ hPa by laser ablation using a $(Zn_{0.97}Li_{0.03})O$ target in which Li was added to Zn at 3 mol %. However, the amount of Li added, substrate temperature and oxygen partial pressure are not limited to these.

Moreover, after vapor deposition of metal aluminum, a continuous patterning process including resist coating, exposure, dry etching and resist removal was carried out to form IDT electrodes 14 and 15 on the $(Zn_{0.97}Li_{0.03})O$ piezoelectric layer 13.

The resulting surface acoustic wave element had an orientation film on the film surface including $(Zn_{0.97}Li_{0.03})O$ (001)//$(Al_{0.97}B_{0.03})_2O_3$ (001)//sapphire (001) in the vertical direction, and $(Zn_{0.97}Li_{0.03})O$ [100]//$(Al_{0.97}B_{0.03})_2O_3$ [110]//sapphire [110] in the in-plane direction.

The $V_s$ of the resulting surface acoustic wave element as determined from the delay time $V_{open}$ of the surface acoustic wave between the IDT electrodes 14 and 15 was 7000 m/s. $k^2$ was 0.01 when determined from the difference with delay time $V_{short}$ of the surface acoustic wave in the case of covering the area between the IDT electrodes 14 and 15 with a metal thin film. Since the resonance frequency was 3.5 GHz. Since $V_s$ is 6000 m/s and $k^2$ is 0.01 in the case of not using the $(Al_{0.97}Cr_{0.03})_2O_3$ substrate 11, the $(Al_{0.97}B_{0.03})_2O_3$ hard layer 12 clearly has the effect of increasing $V_s$ without lowering $k^2$.

In addition, similar effects were obtained in the case of using $(Al_{1-x}M1_x)_2O_3$ ($0 \leq x \leq 0.5$), in which at least one M1=Ga, In, Ti, V, Cr, Mn, Fe or Co was added instead of B, as the hard layer. Moreover, similar effects were also obtained in the case of using $(Zn_{1-x}M2_x)O$ ($0 \leq x \leq 0.5$), in which at least one M2=Mg, Fe, Co, Ni or Cu was added to instead of Li, as the piezoelectric layer instead. In addition, similar effects were also obtained in the case of using $(Al_{1-x}B_x)N$ ($0 \leq x \leq 0.5$) instead of $(Zn_{1-x}M2_x)O$ ($0 \leq x \leq 0.5$) (M2=Li, Mg, Fe, Co, Ni or Cu) for the piezoelectric layer. Moreover, other piezoelectric substances such as $KNbO_3$ and $LiNbO_3$ are also effective. Furthermore, similar effects were also obtained in the case of forming IDT electrodes beneath the piezoelectric layer. Similar effects were also obtained in the case of depositing an $SiO_2$ layer on the surface for improving frequency-temperature characteristics and protecting the surface.

According to the above composition, by depositing the $(Al_{1-x}M1_x)_2O_3$ ($0 \leq x \leq 0.5$) hard layer, in which at least one element M1 (M1=B, Ga, In, Ti, V, Cr, Mn, Fe or Co) is added, on the sapphire single crystal substrate, and then depositing the piezoelectric layer of $(Al_{1-x}B_x)N$ ($0 \leq x \leq 0.5$) or $(Zn_{1-x}M2_x)O$ ($0 \leq x \leq 0.5$) (M2=Li, Mg, Fe, Co, Ni or Cu), a high $V_s$ can be realized without lowering $k^2$.

Third Embodiment of a Surface Acoustic Wave Element

Figure 3:
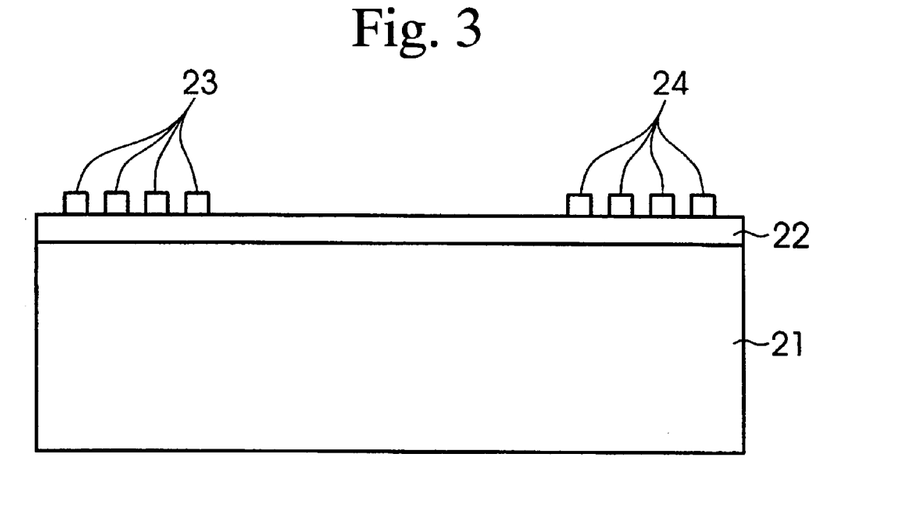
FIG. 3 is a cross-sectional view of a surface acoustic wave element according to a third embodiment of the present invention.

FIG. 3 is a cross-sectional view of a surface wave acoustic element according to a third embodiment of the present invention. An $(Al_{0.97}B_{0.03})N$ piezoelectric layer 22 was deposited on an R plane (102) $(Al_{0.97}Cr_{0.03})_2O_3$ single crystal substrate 21, in which Cr was added to Al at 3 mol %, under conditions of a substrate temperature of 800° C. and oxygen partial pressure of $1.33 \times 10^{-5}$ hPa by laser ablation using an $(Al_{0.97}B_{0.03})N$ target in which BN was added to AlN at 3 mol %. However, the amount of BN added, substrate temperature, oxygen partial pressure and substrate surface azimuth are not limited to these.

Moreover, after vapor deposition of metal aluminum, a continuous patterning process including resist coating, exposure, dry etching and resist removal was carried out to form IDT electrodes 23 and 24 on the $(Al_{0.97}B_{0.03})N$ piezoelectric layer 22.

The resulting surface acoustic wave element had an orientation film on the film surface including $(Al_{0.97}B_{0.03})N$ (110)//$(Al_{0.97}Cr_{0.03})_2O_3$ (102) in the vertical direction, and $(Al_{0.97}B_{0.03})N$ [001]//$(Al_{0.97}Cr_{0.03})_2O_3$ [101] in the in-plane direction.

The $V_s$ of the resulting surface acoustic wave element as determined from the delay time $V_{open}$ of the surface acoustic wave between the IDT electrodes 23 and 24 was 8500 m/s. $k^2$ was 0.01 when determined from the difference with delay time $V_{short}$ of the surface acoustic wave in the case of covering the area between the IDT electrodes 23 and 24 with a metal thin film. In addition, the resonance frequency was 4.2 GHz. Since $V_s$ is 7500 m/s and $k^2$ is 0.01 in the case of an $(Al_{0.97}B_{0.03})N$/sapphire structure, the $(Al_{0.97}Cr_{0.03})_2O_3$ single crystal substrate clearly has the effect of increasing $V_s$ without lowering $k^2$.

In addition, similar effects were obtained in the case of using $(Al_{1-x}M1_x)_2O_3$ ($0 \leq x \leq 0.5$), in which at least one M1=B, Ga, In, Ti, V, Mn, Fe or Co was added instead of Cr, as the single crystal substrate. Moreover, similar effects were also obtained in the case of using $(Zn_{1-x}M2_x)O$ ($0 \leq x \leq 0.5$), in which at least one element M2 (M2=Li, Mg, Fe, Co, Ni or Cu) was added to zinc oxide instead of $(Al_{1-x}B_x)N$ ($0 \leq x \leq 0.5$), as the piezoelectric layer. In addition, other piezoelectric substances such as $KNbO_3$ and $LiNbO_3$ are also effective. Furthermore, similar effects were also obtained in the case of forming the IDT electrodes beneath the piezoelectric layer. Similar effects were also obtained in the case of depositing an $SiO_2$ layer on the surface for improving frequency-temperature characteristics and protecting the surface.

According to the above composition, by depositing the piezoelectric layer of $(Al_{1-x}B_x)N$ ($0 \leq x \leq 0.5$) or $(Zn_{1-x}M2_x)O$ ($0 \leq x \leq 0.5$) (M2=Li, Mg, Fe, Co, Ni or Cu) on the $(Al_{1-x}M1_x)_2O_3$ ($0 \leq x \leq 0.5$) single crystal substrate, in which at least one element M1 (M1=B, Ga, In, Ti, V, Cr, Mn, Fe or Co) is added, a high $V_s$ can be realized without lowering $k^2$.

Fourth Embodiment of a Surface Acoustic Wave Element

Figure 4:
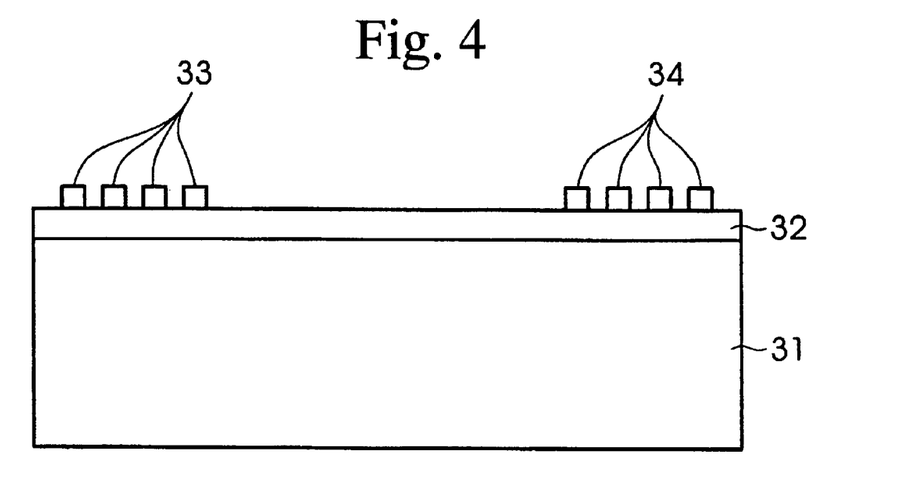
FIG. 4 is a cross-sectional view of a surface acoustic wave element according to a fourth embodiment of the present invention.

FIG. 4 is a cross-sectional view of a surface wave acoustic element according to a fourth embodiment of the present invention. A $(Zn_{0.97}Li_{0.03})O$ piezoelectric layer 32 was deposited on an R plane (102) $(Al_{0.97}Cr_{0.03})_2O_3$ single crystal substrate 31, in which Cr was added to Al at 3 mol %, under conditions of a substrate temperature of 800° C. and oxygen partial pressure of $1.33 \times 10^{-2}$ hPa by laser ablation using a $(Zn_{0.97}Li_{0.03})O$ target in which Li was added to Zn at 3 mol %. However, the amount of Li added, substrate temperature, oxygen partial pressure and substrate surface azimuth are not limited to these.

Moreover, after vapor deposition of metal aluminum, a continuous patterning process including resist coating, exposure, dry etching and resist removal was carried out to form IDT electrodes 33 and 34 on the $(Zn_{0.97}Li_{0.03})O$ piezoelectric layer 32.

The resulting surface acoustic wave element had an orientation film on the film surface including $(Zn_{0.97}Li_{0.03})O$ (001)//$(Al_{0.97}Cr_{0.03})_2O_3$ (001) in the vertical direction, and $(Zn_{0.97}Li_{0.03})O$ [100]//$(Al_{0.97}Cr_{0.03})_2O_3$ [110] in the in-plane direction.

The $V_s$ of the resulting surface acoustic wave element as determined from the delay time $V_{open}$ of the surface acoustic wave between the IDT electrodes 33 and 34 was 7000 m/s. $k^2$ was 0.01 when determined from the difference with delay time $V_{short}$ of the surface acoustic wave in the case of covering the area between the IDT electrodes 33 and 34 with a metal thin film. In addition, the resonance frequency was 3.5 GHz. Since Vs is 6000 m/s and $k^2$ is 0.01 in the case of not using the $(Al_{0.97}Cr_{0.03})_2O_3$ single crystal substrate 31, the $(Al_{0.97}Cr_{0.03})_2O_3$ single crystal substrate 31 clearly has the effect of increasing $V_s$ without lowering $k^2$.

In addition, similar effects were obtained in the case of using $(Al_{1-x}M1_x)_2O_3$ ($0 \leq x \leq 0.5$), in which at least one M1=B, Ga, In, Ti, V, Mn, Fe or Co was added instead of Cr, as the single crystal substrate. Moreover, similar effects were also obtained in the case of using $(Zn_{1-x}M2_x)O$ $(0 \leq x \leq 0.5)$, in which at least one M2=Mg, Fe, Co, Ni or Cu was added instead of Li, as the piezoelectric layer. In addition, similar effects were also obtained in the case of using $(Al_{1-x}B_x)N$ $(0 \leq x \leq 0.5)$ instead of $(Zn_{1-x}M2_x)O$ $(_0 \leq x > 0.5)$ (M2=Li, Mg, Fe, Co, Ni or Cu) for the piezoelectric layer. Moreover, other piezoelectric substances such as $KNbO_3$ and $LiNbO_3$ are also effective. Furthermore, similar effects were also obtained in the case of forming the IDT electrodes beneath the piezoelectric layer. Similar effects were also obtained in the case of depositing an $SiO_2$ layer on the surface for improving frequency-temperature characteristics and protecting the surface.

According to the above composition, by depositing a piezoelectric layer of $(Al_{1-x}B_x)N$ $(0 \leq x \leq 0.5)$ or $(Zn_{1-x}M2_x)O$ $(0 \leq x \leq 0.5)$ (M2=Li, Mg, Fe, Co, Ni or Cu) on an $(Al_{1-x}M1_x)_2O_3$ $(0 \leq x \leq 0.5)$ single crystal substrate, in which at least one element M1 (M1=B, Ga, In, Ti, V, Cr, Mn, Fe or Co) is added, a high $V_s$ can be realized without lowering $k^2$.

Frequency Filter

Figure 5:
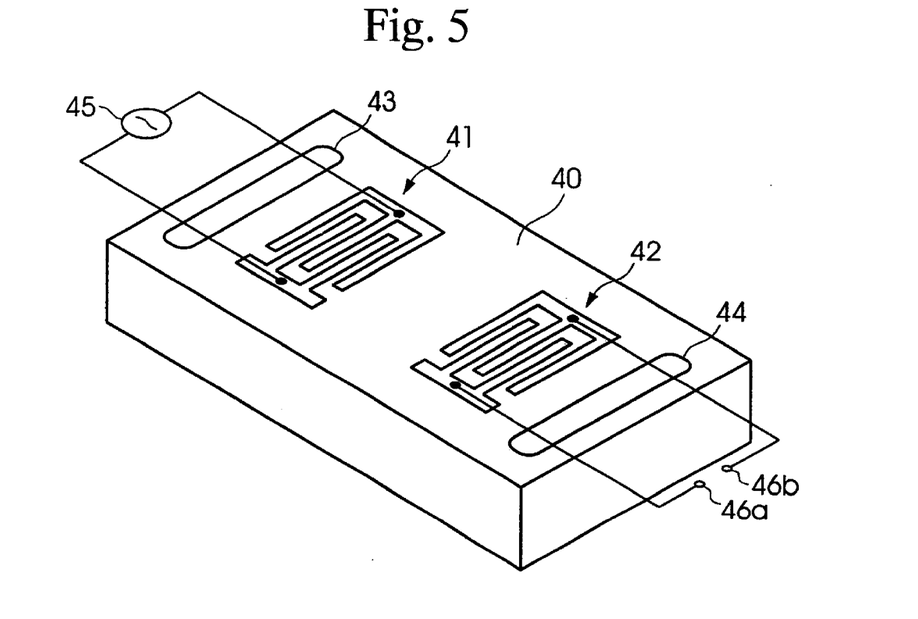
FIG. 5 is a perspective view showing the appearance of a frequency filter according to an embodiment of the present invention.

FIG. 5 is a perspective view showing the appearance of a frequency filter according to an embodiment of the present invention. The frequency filter shown in FIG. 5 has a substrate 40. This substrate 40 is, for example, the substrate in which the $(Al_{0.97}B_{0.03})_2O_3$ hard layer 2 and the $(Al_{0.97}B_{0.03})N$ piezoelectric layer 3 were sequentially laminated and formed on the R plane (102) sapphire single crystal substrate 1 shown in FIG. 1, the substrate in which the $(Al_{0.97}B_{0.03})_2O_3$ hard layer 12 and the $(Zn_{0.97}Li_{0.03})O$ piezoelectric layer 13 were sequentially laminated and formed on the C plane (001) sapphire single crystal substrate 11 shown in FIG. 2, the substrate in which the $(Al_{0.97}B_{0.03})N$ piezoelectric layer 22 was laminated and formed on the R plane (102) $(Al_{0.97}Cr_{0.03})_2O_3$ single crystal substrate 21 shown in FIG. 3, or the substrate in which the $(Zn_{0.97}Li_{0.03})O$ piezoelectric layer 32 was laminated and formed on the R plane (102) $(Al_{0.97}Cr_{0.03})_2O_3$ single crystal substrate 31.

IDT electrodes 41 and 42 are formed on the upper surface of the substrate 40. The IDT electrodes 41 and 42 are formed, for example from Al or Al alloy, and their thickness is set to be roughly $\frac{1}{100}$ of their pitch. In addition, sound absorbing materials 43 and 44 are formed on the upper surface of the substrate 40 so as to insert the IDT electrodes 41 and 42 therebetween. The sound absorbing materials 43 and 44 absorb surface acoustic waves propagating over the surface of the substrate 40. A high-frequency signal source 45 is connected to the IDT electrode 41 formed on the substrate 40, and a signal line is connected to the IDT 42. Furthermore, the above IDT electrode 41 corresponds to the first electrode referred to in the present invention, while the IDT electrode 42 corresponds to the second electrode referred to in the present invention.

In the above composition, when a high-frequency signal is output from a high-frequency signal source 45, this high-frequency signal is applied to the IDT electrode 41, as a result of which a surface acoustic wave is generated on the upper surface of the substrate 40. This surface acoustic wave propagates over the upper surface of the substrate 40 at a velocity of about 6000–8500 m/s. Although the surface acoustic wave that has propagated to the sound absorbing material 43 from the IDT electrode 41 is absorbed by the sound absorbing material 43, the surface acoustic wave that has propagated to the IDT electrode 42 with a specific frequency or a frequency of a specific band, which is stipulated according to the pitch and so forth of the IDT electrode 42, are converted to electrical signals followed by output to terminals 46a and 46b by way of signal lines. Furthermore, other surface acoustic waves excepting the above surface acoustic wave with the specific frequency component or the frequency component of the specific band are mainly absorbed by sound absorbing material 44 after passing through IDT electrode 42. Thus, only the surface acoustic wave of the specific frequency or the frequency of the specific band can be obtained (filtered) from electrical signals supplied to the IDT electrode 41 equipped with the frequency filter of the present embodiment.

Frequency Oscillator

Figure 6:
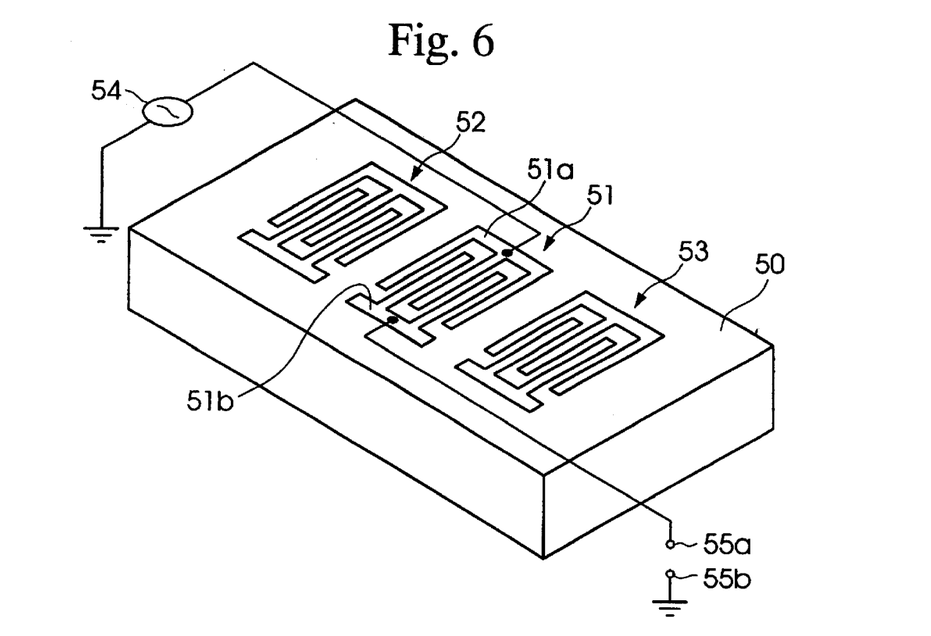
FIG. 6 is a perspective view showing the appearance of a frequency oscillator according to an embodiment of the present invention.

FIG. 6 is a perspective view showing the appearance of a frequency oscillator according to an embodiment of the present invention. The frequency oscillator shown in FIG. 6 has a substrate 50. This substrate 50 is, for example, the substrate in which the $(Al_{0.97}B_{0.03})_2O_3$ hard layer 2 and the $(Al_{0.97}B_{0.03})N$ piezoelectric layer 3 were sequentially laminated and formed on the R plane (102) sapphire single crystal substrate 1 shown in FIG. 1, the substrate in which the $(Al_{0.97}B_{0.03})_2O_3$ hard layer 12 and the $(Zn_{0.97}Li_{0.03})O$ piezoelectric layer 13 were sequentially laminated and formed on the C plane (001) sapphire single crystal substrate 11 shown in FIG. 2, the substrate in which the $(Al_{0.97}B_{0.03})N$ piezoelectric layer 22 was laminated and formed on the R plane (102) $(Al_{0.97}Cr_{0.03})_2O_3$ single crystal substrate 21 shown in FIG. 3, or the substrate in which the $(Zn_{0.97}Li_{0.03})O$ piezoelectric layer 32 was laminated and formed on the R plane (102) $(Al_{0.97}Cr_{0.03})_2O_3$ single crystal substrate 31.

An IDT electrode 51 is formed on the upper surface of this substrate 50, and IDT electrodes 52 and 53 are formed so as to insert the IDT electrode 51 therebetween. The IDT electrodes 51 through 53 are formed from Al or Al alloy, and their respective thicknesses are set to be about $\frac{1}{100}$ of their respective pitches. A high-frequency signal source 54 is connected to one comb-tooth-shaped electrode 51a that composes the IDT electrode 51, and a signal line is connected to another comb-tooth-shaped electrode 51b. Furthermore, the IDT electrode 51 corresponds to the electrical signal application electrode referred to in the present invention, while the IDT electrodes 52 and 53 correspond to the resonance electrodes referred to in the present invention that cause a specific frequency component or a frequency component of a specific band of a surface acoustic wave generated by the IDT electrode 51 to resonate.

In the above composition, when a high-frequency signal is output from the high-frequency signal source 54, this high-frequency signal is applied to the comb-tooth-shaped electrode 51a of the IDT electrode 51, as a result of which a surface acoustic wave that propagates on the side of the IDT electrode 52 and a surface acoustic wave that propagates on the side of the IDT electrode 53 are generated on the upper surface of the substrate 50. Furthermore, the velocity of these surface acoustic waves is about 6000–8500 m/s. Those surface acoustic waves of a specific frequency component are reflected by the IDT electrode 52 and the IDT electrode 53 resulting in the formation of standing waves between the IDT electrode 52 and the IDT electrode 53. These specific frequency components or frequency components of a specific band resonate and increase in amplitude by repeating reflection of these surface acoustic waves of a specific frequency component by IDT electrodes 52 and 53. A portion of the surface acoustic waves of the specific frequency component or the frequency component of the specific band is output from another comb-tooth-shaped electrode 51b of the IDT electrode 51, and an electrical signal of a frequency (or frequency having a certain band)

corresponding to the resonance frequency between the IDT electrode 52 and the IDT electrode 53 can be output to a terminal 55a and a terminal 55b.

Figure 7A:
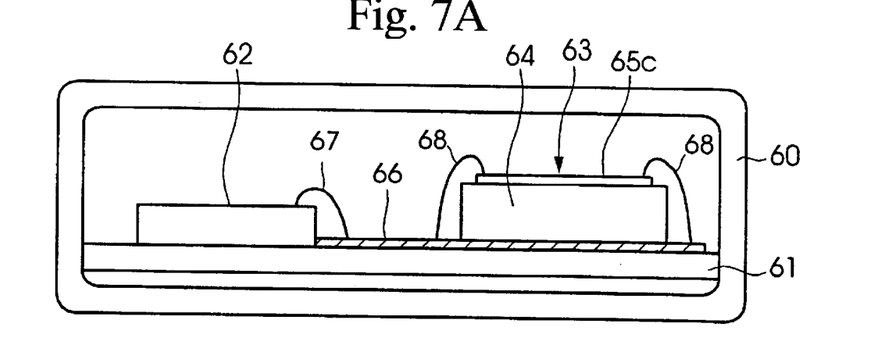
FIGS. 7A and 7B indicate an example of applying the surface acoustic wave element (frequency oscillator) according to an embodiment of the present invention to a voltage-controlled SAW oscillator (VCSO), with FIG. 7A being a side perspective view and FIG. 7B being an overhead perspective view.
Figure 7B:
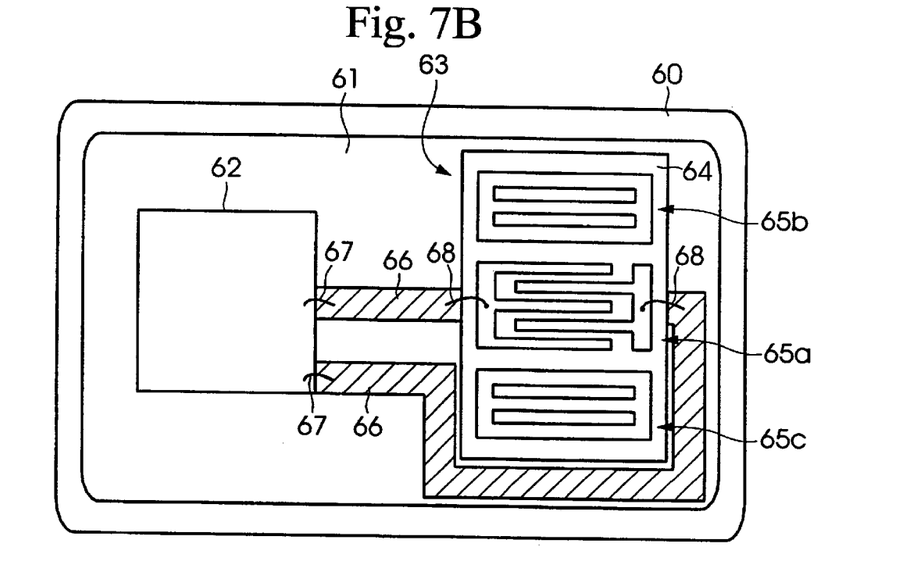

FIGS. 7A and 7B show an example of applying the surface acoustic wave element (frequency oscillator) of an embodiment of the present invention to a voltage controlled SAW oscillator (VCSO). FIG. 7A is a side perspective view and FIG. 7B is an overhead perspective view. The VCSO is mounted inside a metal (aluminum or stainless steel) case 60. Reference symbol 61 represents a substrate, and an integrated circuit (IC) and a frequency oscillator 63 are mounted on this substrate 61. An IC 62 controls the frequency applied to the frequency oscillator 63 corresponding to the voltage value input from an external circuit (not shown).

The frequency oscillator 63 has IDT electrodes 65a through 65c formed on a substrate 64, and its composition is nearly the same as the frequency oscillator shown in FIG. 6. Furthermore, the substrate 64 is, for example, the substrate in which the $(Al_{0.97}B_{0.03})_2O_3$ hard layer 2 and the $(Al_{0.97}B_{0.03})N$ piezoelectric layer 3 were sequentially laminated and formed on the R plane (102) sapphire single crystal substrate 1 shown in FIG. 1, the substrate in which the $(Al_{0.97}B_{0.03})_2O_3$ hard layer 12 and the $(Zn_{0.97}Li_{0.03})O$ piezoelectric layer 13 were sequentially laminated and formed on the C plane (001) sapphire single crystal substrate 11 shown in FIG. 2, the substrate in which the $(Al_{0.97}B_{0.03})N$ piezoelectric layer 22 was laminated and formed on the R plane (102) $(Al_{0.97}Cr_{0.03})_2O_3$ single crystal substrate 21 shown in FIG. 3, or the substrate in which the $(Zn_{0.97}Li_{0.03})O$ piezoelectric layer 32 was laminated and formed on the R plane (102) $(Al_{0.97}Cr_{0.03})_2O_3$ single crystal substrate 31.

In addition, a wiring 66 is patterned on the substrate 61 for electrically connecting the IC 62 and the frequency oscillator 63. The IC 62 and the wiring 66 are connected by a wire 67 such as a gold wire, and the frequency oscillator 63 and the wiring 66 are connected by a wire 68 such as a gold wire. As a result, the IC 62 and the frequency oscillator 63 are electrically connected by means of the wiring 66.

Figure 8:
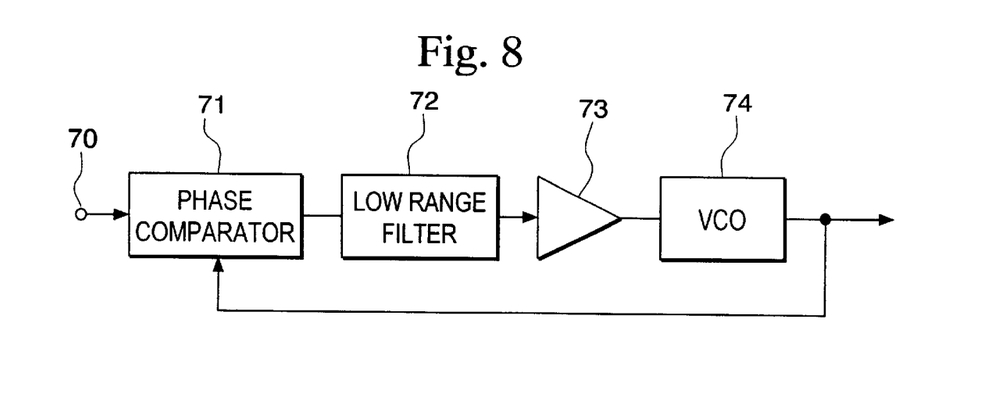
FIG. 8 is a block diagram showing the basic configuration of a PLL circuit.

The VCSO shown in FIGS. 7A and 7B is used as, for example, the voltage controlled oscillator (VCO) of a PLL circuit shown in FIG. 8. Here, a brief explanation of the PLL circuit is provided. FIG. 8 is a block diagram showing the basic configuration of the PLL circuit. As shown in FIG. 8, the PLL circuit includes a phase comparator 71, a low range filter 72, an amplifier 73, and a VCO 74.

The phase comparator 71 compares the phase (or frequency) of a signal input from an input terminal 70 with the phase (or frequency) of a signal output from the VCO 74, and outputs an error voltage signal of which the value is determined according to the resulting difference. A low range filter 72 only allows to pass the low frequency component at the location of the error voltage signal output from the phase comparator 71, while the amplifier 73 amplifies the signal output from the low range filter 72. The VCO 74 is an oscillation circuit in which the oscillation frequency changes continuously within a certain frequency range corresponding to the input voltage value. The PLL circuit operates so that the difference between the phase (or frequency) input from the input terminal 70 and the phase (or frequency) of the signal output from the VCO 74 decreases, and synchronizes the frequency of the signal output from the VCO 74 with the frequency of the signal input from the input terminal 70. After the frequency of the signal output from the VCO 74 is synchronized with the frequency of the signal input from the input terminal 70, it outputs the signal matching with the signal input from the input terminal 70, except for a fixed phase difference, or following changes in the input signal.

Electronic Circuit

Figure 9:
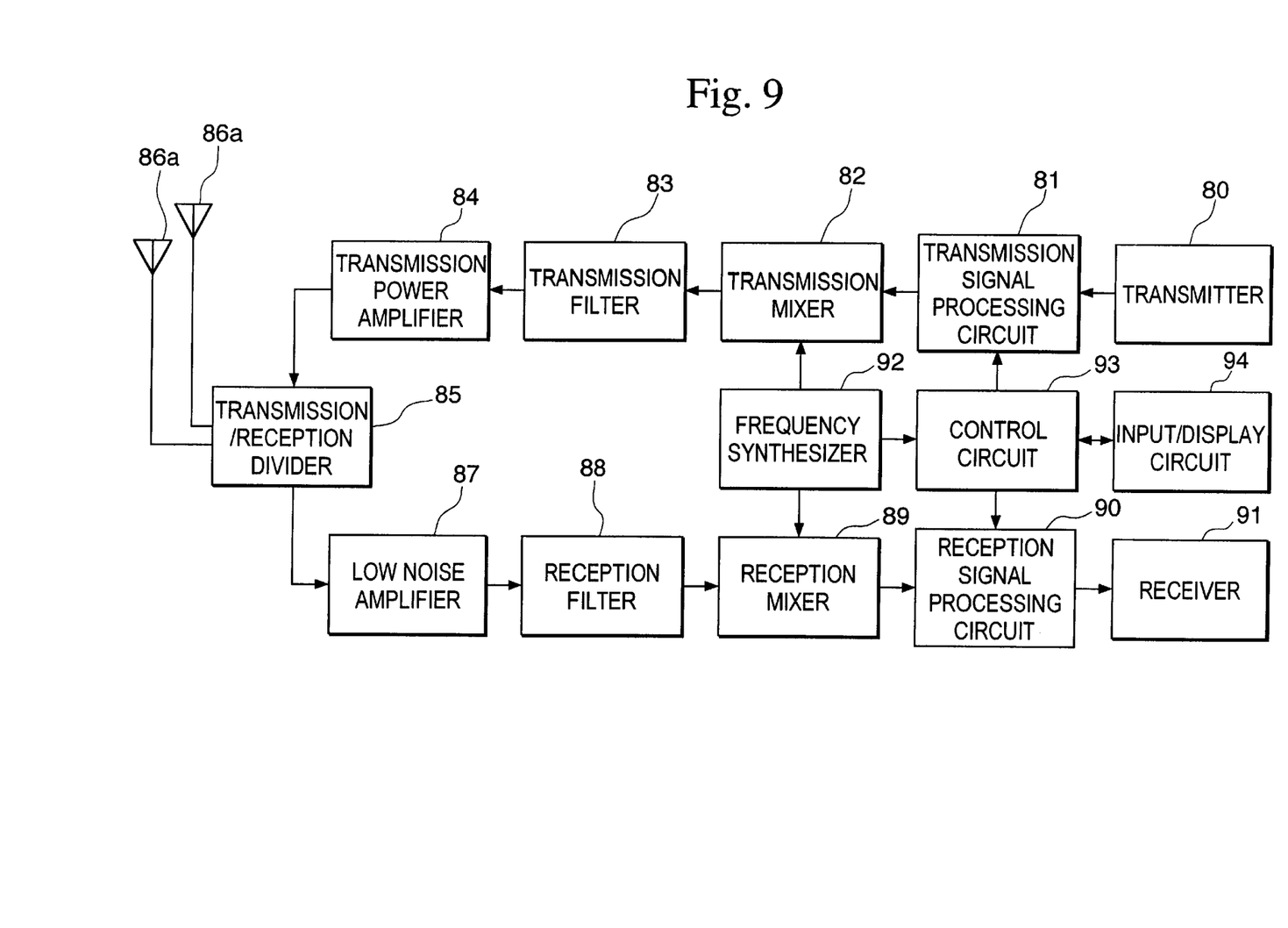
FIG. 9 is a block diagram showing the electrical configuration of an electronic circuit according to an embodiment of the present invention.
Figure 10:
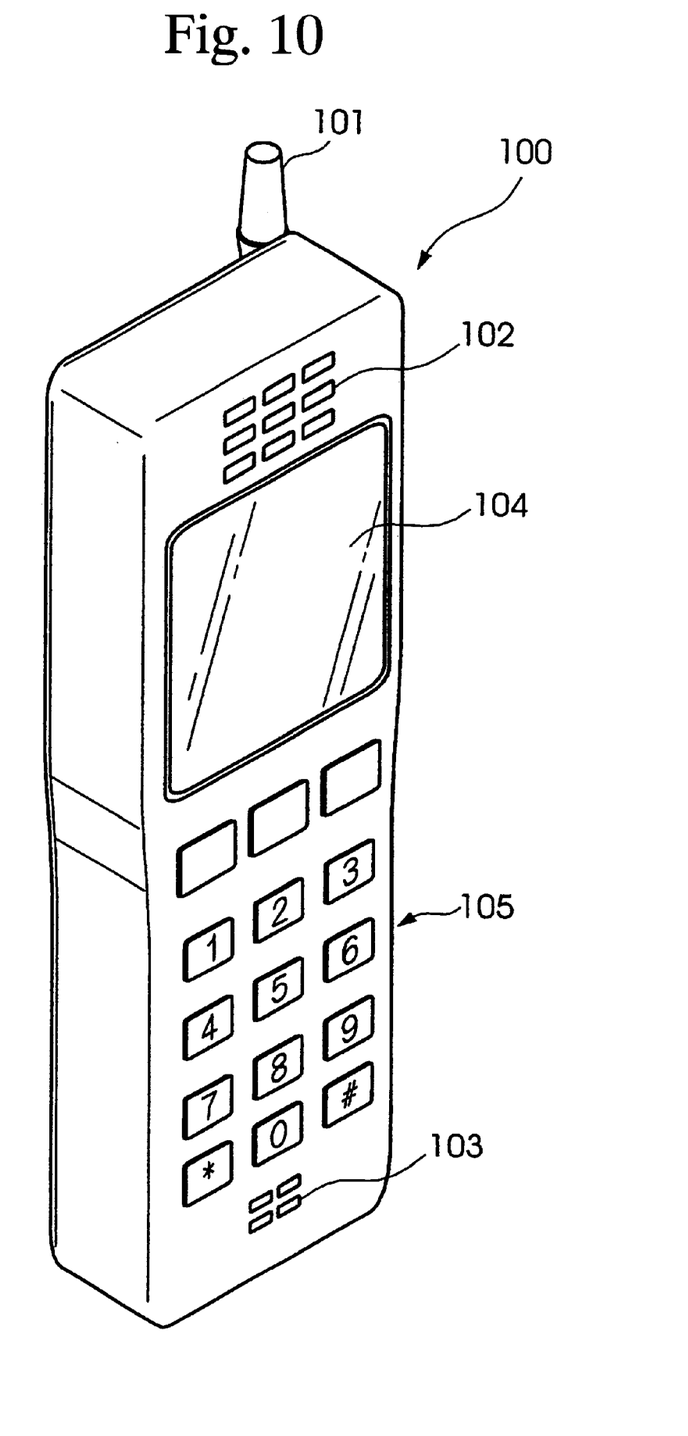
FIG. 10 is a perspective view showing an example of the appearance of a cellular telephone as an example of an electronic apparatus according to an embodiment of the present invention.

FIG. 9 is a block diagram showing the electrical configuration of an electronic circuit according to an embodiment of the present invention. Furthermore, the electronic circuit shown in FIG. 9 is a circuit provided within, for example, a cellular telephone 100 shown in FIG. 10. FIG. 10 is a perspective view showing one example of the appearance of the cellular telephone as an example of an electronic apparatus according to an embodiment of the present invention. The cellular telephone 100 shown in FIG. 10 includes an antenna 101, a receiver 102, a transmitter 103, a liquid crystal display 104 and an operating buttons 105.

The electronic circuit shown in FIG. 9 shows the basic configuration of the electronic circuit provided within the cellular telephone 100, and includes a transmitter 80, a transmission signal processing circuit 81, a transmission mixer 82, a transmission filter 83, a transmission power amplifier 84, a transmission-reception divider 85, antennas 86a and 86b, a low noise amplifier 87, a reception filter 88, a reception mixer 89, a reception signal processing circuit 90, a receiver 91, a frequency synthesizer 92, a control circuit 93 and an input/display circuit 94. Furthermore, cellular telephones currently used practically have a more complex circuit configuration due to multiple frequency conversion processing.

The transmitter 80 is realized with, for example, a microphone that converts sound wave signals into electrical signals, and is equivalent to the transmitter 103 shown in FIG. 10. The transmission signal processing circuit 81 is a circuit that performs, for example, D/A conversion processing and modulation processing on electrical signals output from the transmitter 80. The transmission mixer 82 mixes signals output from the transmission signal processing circuit 81 using signals output from the frequency synthesizer 92. Furthermore, the frequency of signals supplied to the transmission mixer 82 is about, for example, 380 MHz. The transmission filter 83 allows to pass only signals of a frequency required for the intermediate frequency (IF), and cuts out signals having an unnecessary frequency. Furthermore, signals output from the transmission filter 83 are converted to RF signals by a conversion circuit not shown. The frequency of these RF signals is about, for example, 1.9 GHz. The transmission power amplifier 84 amplifies the electrical power of RF signals output from the transmission filter 83, and outputs them to the transmission-reception divider 85.

The transmission-reception divider 85 outputs the RF signal output from the transmission power amplifier 84 to the antennas 86a and 86b, and then transmits the signal from the antennas 86a and 86b in the form of a radio wave. In addition, the transmission-reception divider 85 divides reception signals received with the antennas 86a and 86b, and outputs them to the low noise amplifier 87. Furthermore, the frequency of the reception signals output from the transmission-reception divider 85 is about, for example, 2.1 GHz. The low noise amplifier 87 amplifies the reception signal from the transmission-reception divider 85. Furthermore, signals output from the low noise amplifier 87 are converted to intermediate frequency (IF) signals by a conversion circuit not shown.

The reception filter 88 only allows to pass signals of a frequency required for the intermediate frequency (IF) that have been converted by a conversion circuit not shown, and cuts out those signals of an unnecessary frequency. The reception mixer 89 mixes the signals output from the transmission signal processing circuit 81 using signals output from the frequency synthesizer 92. Furthermore, the intermediate frequency of signals supplied to the reception mixer 89 is about, for example, 190 MHz. The reception signal processing circuit 90 is a circuit that performs, for example, A/D conversion processing and demodulation processing on signals output from the reception mixer 89. The receiver 91 is realized with, for example, a small speaker that converts electrical signals into sound waves, and is equivalent to the receiver 102 shown in FIG. 10.

The frequency synthesizer 92 is a circuit that generates signals supplied to the transmission mixer 83 (having a frequency of about, for example, 380 MHz) and signals supplied to the reception mixer 89 (having a frequency of about, for example, 190 MHz). Furthermore, the frequency synthesizer 92 is equipped with a PLL circuit that transmits at an oscillation frequency of, for example, 760 MHz, generates signals having a frequency of 380 MHz by dividing the signals output from this PLL circuit, and generates signals having a frequency of 190 MHz by further dividing those signals. The control circuit 92 controls the overall operation of the cellular telephone by controlling the transmission signal processing circuit 81, the reception signal processing circuit 90, the frequency synthesizer 92 and the input/display circuit 94. The input/display circuit 94 displays device status to a user of the cellular telephone 100 or is used to input the instructions of the operator, and is equivalent to, for example, the liquid crystal display 104 and the operating buttons 105 shown in FIG. 10.

In an electronic circuit having the above configuration, the frequency filter shown in FIG. 5 is used for the transmission filter 83 and the reception filter 88. The filtering frequencies (pass frequencies) are separately set for the transmission filter 83 and the reception filter 88 according to the frequency required from the signals output from the transmission mixer 82 and the frequency required by the reception mixer 89. In addition, the PLL circuit provided within the frequency synthesizer 92 is provided with the frequency oscillator shown in FIG. 6 or the frequency oscillator (VCSO) shown in FIG. 7 for the VCO 74 of the PLL circuit shown in FIG. 8.

Although the above has provided explanations of the surface acoustic wave element, the frequency filter, the frequency oscillator, the electronic circuit and the electronic apparatus according to embodiments of the present invention, the present invention is not limited to the above embodiments, and can be altered as desired within the scope of the present invention. For example, the cellular telephone has been explained as an example of an electronic apparatus, and the electronic circuit provided within the cellular telephone has been explained as an example of an electronic circuit in the above embodiments. However, this does not mean that the present invention is limited to cellular telephones, and can be applied to various mobile communication devices and electronic circuits provided therein.

Moreover, the present invention can also be applied to not only mobile communication devices, but also communication equipments used in a stationary state such as tuners for receiving BS and CS broadcasts, as well as electronic circuits provided therein. Moreover, the present invention can be applied to not only communication equipments using radio waves propagated through the air for the communication carrier, but also electronic apparatuss such as HUB that use high-frequency signals propagated through coaxial cables or optical signals propagated through optic fiber cables, as well as electronic circuits provided therein.

As has been explained above, according to the present invention, by using the hard layer or the single crystal substrate in which metal oxide having the same corundum crystal structure as sapphire is incorporated in sapphire as a solid solution, the propagation velocity of the surface acoustic wave is increased due to increasing Young's modulus or decreasing density, enabling the resulting surface acoustic wave element to be used in a higher frequency range, while also having the effect of realizing high-frequency communication devices such as high-frequency oscillators without using a diamond hard layer.

What is claimed is:

1. A surface acoustic wave element including:

a sapphire single crystal substrate;

a hard layer formed on said sapphire single crystal substrate and having a composition containing $(Al_{1-x}M1_x)_2O_3$ ($0 \leq x \leq 0.5$) in which at least one element M1 (M1=B, Ga, In, Ti, V, Cr, Mn, Fe, Co) is added to sapphire; and a piezoelectric layer formed on said hard layer.

2. A surface acoustic wave element according to claim 1, wherein said hard layer has a corundum crystal structure.

3. A surface acoustic wave element according to claim 1, wherein said piezoelectric layer has a composition containing $(Al_{1-x}B_x)N$ ($0 \leq x \leq 0.5$) in which boron nitride is added to aluminum nitride, and has a wurtzite crystal structure.

4. A surface acoustic wave element according to claim 1, wherein said piezoelectric layer has a composition containing $(Zn_{1-x}M2_x)O$ ($0 \leq x \leq 0.5$) in which at least one element M2 (M2=Li, Mg, Fe, Co., Ni, Cu) is added to zinc oxide, and has a wurtzite crystal structure.

5. A surface acoustic wave element including:

a single crystal substrate having a composition containing $(Al_{1-x}M1_x)_2O_3$ ($0 \leq x \leq 0.5$) in which element M1 (M1=B, Ga, In, Ti, V, Cr, Mn, Fe, Co) is added to sapphire, and having a corundum crystal structure; and a piezoelectric layer formed on said single crystal substrate.

6. A surface acoustic wave element according to claim 5, wherein said piezoelectric layer has a composition containing $(Al_{1-x}B_x)N$ ($0 \leq x \leq 0.5$) in which boron nitride is added to aluminum nitride, and has a wurtzite crystal structure.

7. A surface acoustic wave element according to claim 5, wherein said piezoelectric layer has a composition containing $(Zn_{1-x}M2_x)O$ ($0 \leq x \leq 0.5$) in which at least one element M2 (M2=Li, Mg, Fe, Co., Ni, Cu) is added to zinc oxide, and has a wurtzite crystal structure.

8. A frequency filter including: a first electrode formed on the piezoelectric layer equipped with the surface acoustic wave elements of claim 1; and a second electrode which is formed on said piezoelectric layer and which converts to an electrical signal by resonating to a specific frequency or a frequency of a specific band of a surface acoustic wave generated in said piezoelectric layer by an electrical signal applied to said first electrode.

9. A frequency oscillator including: an electrical signal application electrode which is formed on the piezoelectric layer equipped with the surface wave acoustic elements of claim 1 and which generates a surface acoustic wave in said piezoelectric layer according to an applied electrical signal; and a resonance electrode which is formed on said piezoelectric layer and which resonates a specific frequency component or a frequency component of a specific band of the surface acoustic wave generated by said electrical signal application electrode.

10. An electronic circuit including:

the frequency oscillator according to claim 9; and an electrical signal supply element which applies an electrical signal to the electrical signal application electrode provided in said frequency oscillator; wherein, a specific frequency component is selected from the frequency components of said electrical signal or the frequency components of said electrical signal are converted to a specific frequency component, or a prescribed modulation is imparted to said electrical signal followed by a prescribed demodulation or prescribed wave detection.

11. An electronic apparatus including at least one of the frequency filter according to claim 8.

12. An electronic apparatus including at least one of the frequency oscillator according to claim 9.

13. An electronic apparatus including at least one of the electronic circuit according to claim 10.

* * * * *